(12) United States Patent
Ha et al.

(10) Patent No.: US 9,236,319 B2
(45) Date of Patent: Jan. 12, 2016

(54) STACKED INTEGRATED CIRCUIT PACKAGE SYSTEM

(75) Inventors: Jong-Woo Ha, Seoul (KR); Flynn Carson, Redwood City, CA (US); BumJoon Hong, Seoul (KR); SeongMin Lee, Seoul (KR)

(73) Assignee: STATS ChipPAC Ltd., Singapore (SG)

( * ) Notice: Subject to any disclaimer, the term of this patent is extended or adjusted under 35 U.S.C. 154(b) by 843 days.

(21) Appl. No.: 12/056,402

(22) Filed: Mar. 27, 2008

(65) Prior Publication Data
US 2009/0243072 A1    Oct. 1, 2009

(51) Int. Cl.
| | |
|---|---|
| H01L 23/02 | (2006.01) |
| H01L 23/31 | (2006.01) |
| H01L 25/03 | (2006.01) |
| H01L 25/065 | (2006.01) |
| H01L 25/10 | (2006.01) |
| H01L 23/00 | (2006.01) |

(52) U.S. Cl.
CPC ............ *H01L 23/3128* (2013.01); *H01L 25/03* (2013.01); *H01L 25/0657* (2013.01); *H01L 25/105* (2013.01); *H01L 24/48* (2013.01); *H01L 2224/16225* (2013.01); *H01L 2224/32145* (2013.01); *H01L 2224/32225* (2013.01); *H01L 2224/48225* (2013.01); *H01L 2224/48227* (2013.01); *H01L 2224/73204* (2013.01); *H01L 2224/73253* (2013.01); *H01L 2224/73265* (2013.01); *H01L 2225/0651* (2013.01); *H01L 2225/06568* (2013.01); *H01L 2225/107* (2013.01); *H01L 2225/1023* (2013.01); *H01L 2225/1058* (2013.01); *H01L 2924/15311* (2013.01); *H01L 2924/15321* (2013.01); *H01L 2924/15331* (2013.01); *H01L 2924/1815* (2013.01); *H01L 2924/19041* (2013.01); *H01L 2924/19107* (2013.01)

(58) Field of Classification Search
CPC ...................................................... H01L 25/105
USPC ........................................... 257/686, E23.169
See application file for complete search history.

(56) References Cited

U.S. PATENT DOCUMENTS

| | | | |
|---|---|---|---|
| 6,504,241 B1 | 1/2003 | Yanagida | |
| 6,531,338 B2 | 3/2003 | Akram et al. | |
| 6,603,072 B1 | 8/2003 | Foster et al. | |
| 6,617,193 B1 | 9/2003 | Toshio et al. | |
| 6,861,288 B2 | 3/2005 | Shim et al. | |
| 7,049,692 B2 | 5/2006 | Nishimura et al. | |
| 7,242,081 B1 | 7/2007 | Lee | |
| 7,288,835 B2 | 10/2007 | Yim et al. | |
| 7,309,913 B2 | 12/2007 | Shim et al. | |
| 7,372,141 B2 | 5/2008 | Karnezos et al. | |
| 7,429,787 B2 | 9/2008 | Karnezos et al. | |
| 2006/0113653 A1* | 6/2006 | Xiaoqi et al. ................ | 257/686 |
| 2006/0175695 A1* | 8/2006 | Lee ................ | 257/686 |
| 2006/0220256 A1 | 10/2006 | Shim et al. | |
| 2007/0045796 A1 | 3/2007 | Ye et al. | |
| 2007/0045803 A1* | 3/2007 | Ye et al. ................ | 257/686 |
| 2007/0090532 A1* | 4/2007 | Lehman ................ | 257/777 |
| 2007/0278696 A1 | 12/2007 | Lu et al. | |

(Continued)

*Primary Examiner* — Hsin-Yi Hsieh
(74) *Attorney, Agent, or Firm* — Ishimaru & Associates LLP

(57) ABSTRACT

A stacked integrated circuit package system includes: providing a base integrated circuit package, and mounting a top integrated circuit package having a top interposer and a top encapsulation with a cavity therein or the cavity as a space between top intra-stack interconnects and the top interposer, with the top interposer exposed by the cavity, over the base integrated circuit package.

16 Claims, 5 Drawing Sheets

(56) References Cited

U.S. PATENT DOCUMENTS

| | | |
|---|---|---|
| 2008/0211084 A1 | 9/2008 | Chow et al. |
| 2009/0152701 A1* | 6/2009 | Kuan et al. .................... 257/686 |
| 2009/0236731 A1 | 9/2009 | Shim et al. |
| 2009/0243073 A1 | 10/2009 | Carson et al. |

* cited by examiner

STACKED INTEGRATED CIRCUIT PACKAGE SYSTEM

CROSS-REFERENCE TO RELATED APPLICATION

The present application contains subject matter also related to concurrently filed U.S. patent application Ser. No. 12/056,418, now U.S. Pat. No. 7,750,454. The related application is assigned to STATS ChipPAC Ltd. and the subject matter thereof is incorporated herein by reference thereto.

The present application also contains subject matter related to U.S. patent application Ser. No. 12/040,558 filed Feb. 29, 2008, now U.S. Pat. No. 8,685,792. The related application is assigned to STATS ChipPAC Ltd. and the subject matter thereof is incorporated herein by reference thereto.

TECHNICAL FIELD

The present invention relates generally to an integrated circuit package system, and more particularly to a system with a stacked integrated circuit package system.

BACKGROUND ART

Electronic devices such as smart phones, personal digital assistants, location based devices, digital cameras, music players, computers, or transportation, have become an integral part of many daily activities. Key components of these electronic devices are integrated circuit devices. These tiny integrated circuits must perform during daily activities including a wide variety of environmental conditions as well as potentially damaging forces. Many and varied types of packaging, intended for protection, interconnection or mounting, have been developed for integrated circuit devices.

Integrated circuit dies are conventionally enclosed in plastic packages that provide protection from hostile environments and enable electrical interconnection between the integrated circuit die and an underlying substrate such as a printed circuit board (PCB). The elements of such a package include: a lead frame or substrate, an integrated circuit die, bonding material to attach the integrated circuit die to the lead frame or substrate, bond wires or other connectors that electrically connect pads on the integrated circuit die to the lead frame or substrate. The package can also include a plastic or other insulating material that covers the components and forms the exterior of the package.

Wafer manufacturing strives to reduce transistor or capacitor feature size in order to increase circuit density and enhance functionality. Device geometries with sub-micron line widths are so common that individual chips routinely contain millions of electronic devices. Reduced feature size has been quite successful in improving electronic systems, and continuous development is expected in the future. However, significant obstacles to further reduction in feature size are being encountered. These obstacles include defect density control, optical system resolution limits, and availability of processing material and equipment. Attention has therefore increasingly shifted to semiconductor packaging as a means to fulfill the relentless demands for enhanced system performance.

Drawbacks of conventional designs include a relatively large footprint of the package on the mounting surface of motherboard. The footprint reflects dimensions that are typically the maximum of the package, namely, the maximum x-y dimensions of the package. In applications where mounting space is at a premium, such as pagers, portable telephones, and personal computers, among others, a large footprint is undesirable. With the goal of increasing the amount of circuitry in a package, but without increasing the area of the package so that the package does not take up any more space on the circuit board, manufacturers have been stacking two or more die within a single package. Unfortunately, sufficient overlap for electrical interconnect, large footprint top packages, increased device integration, pre-testing, and interconnect lengths have plagued previous package designs.

Thus, a need still remains for a stacked integrated circuit package system to improve area and volume. In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a stacked integrated circuit package system including a base integrated circuit package, and mounting a top integrated circuit package having a top interposer and a top encapsulation with a cavity therein or the cavity as a space between top intra-stack interconnects and the top interposer, with the top interposer exposed by the cavity, over the base integrated circuit package.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
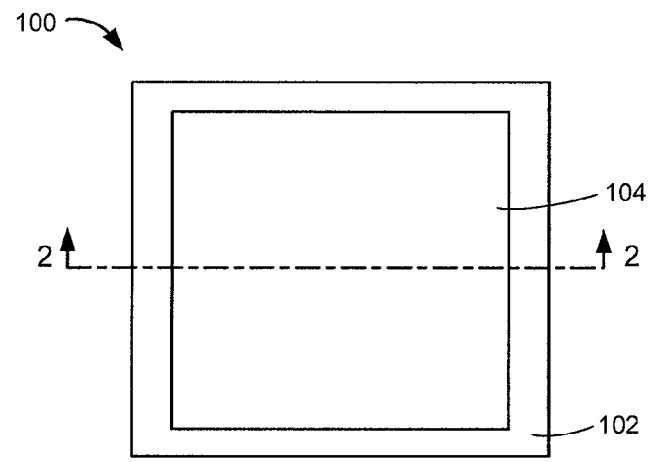
FIG. 1 is a top view of a stacked integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGS. Generally, the invention can be operated in any orientation.

In addition, where multiple embodiments are disclosed and described having some features in common, for clarity and ease of illustration, description, and comprehension thereof, similar and like features from one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a top view of a stacked integrated circuit package system 100 in a first embodiment of the present invention. The top view depicts a top encapsulation 102, such as a cover including an epoxy molding compound. A top interposer 104, such as a laminated substrate, can be exposed by the top encapsulation 102.

Figure 2:
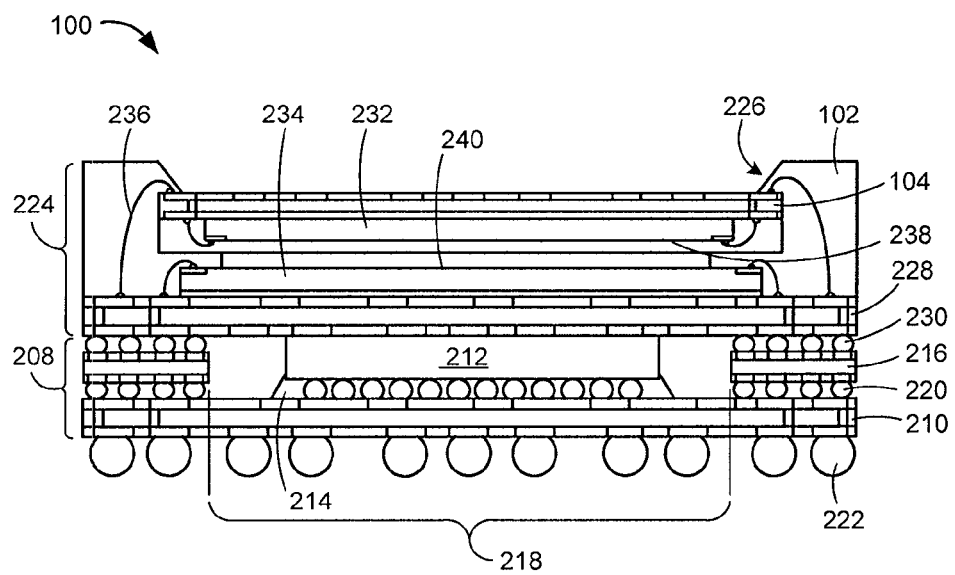
FIG. 2 is a cross-sectional view of the stacked integrated circuit package system along line 2-2 of FIG. 1.

Referring now to FIG. 2, therein is shown a cross-sectional view of the stacked integrated circuit package system 100 along line 2-2 of FIG. 1. The cross-sectional view depicts a base integrated circuit package 208. The base integrated circuit package 208 can include a base package carrier 210, such as a laminated substrate and a first base integrated circuit device 212 such as a flip chip, an encapsulated integrated circuit, a wire bonded chip, or a packaged integrated circuit. The first base integrated circuit device 212 can be mounted over and on the base package carrier 210. Optionally, the base integrated circuit package 208 can include a base underfill 214, such as an epoxy molding compound, under the first base integrated circuit device 212.

The base integrated circuit package 208 can include additional integrated circuit devices, such as one or more flip chips, wire bonded chips, or packaged integrated circuits. The base integrated circuit package 208 may be or may include a Known Good Package ("KGP") that has been functionally tested.

A base interposer 216 can be mounted over the base package carrier 210. For example, the base interposer 216, such as a laminated substrate having a central aperture 218, can be mounted over the base package carrier 210 with the first base integrated circuit device 212 within the central aperture 218 of the base interposer 216. A base interposer interconnect 220, such as a solder ball, can be used to couple the base interposer 216 with the base package carrier 210.

A base external interconnect 222, such as a solder ball, can attach to the stacked integrated circuit package system 100 for connection to the next system level (not shown), such as a printed circuit board or another integrated circuit package system. In this example, the base external interconnect 222 is attached below and to the base package carrier 210.

A top integrated circuit package 224 can be mounted over the base integrated circuit package 208. The top encapsulation 102 of the top integrated circuit package 224 includes a recess 226 which exposes the top interposer 104. The top integrated circuit package 224 can include a top package carrier 228, such as a substrate. In this example, the recess 226 is over the top package carrier 228.

A base intra-stack interconnect 230, such as a solder ball, can form an interconnection between the base integrated circuit package 208 and the top integrated circuit package 224. Other examples of the base intra-stack interconnect 230 include column grid arrays, pin interconnects, post interconnects, interconnects formed using folded printed circuit boards (PCBs) or combinations thereof. In this example, the base intra-stack interconnect 230 is mounted on and over a top surface of the base interposer 216 and couples the base integrated circuit package 208 to the top integrated circuit package 224 through a bottom surface of the top package carrier 228. The bottom surface of the top package carrier 228 is in direct contact with the first base integrated circuit device 212.

The top integrated circuit package 224 can include a first top integrated circuit device 232 such as an integrated circuit die, a flip chip, a wire bonded chip, or a packaged integrated circuit. The first top integrated circuit device 232 can be below the top interposer 104 and can be mounted on a bottom side of the top interposer 104 opposite the recess 226. The top package carrier 228 can be below the top interposer 104 and be in contact with the top encapsulation 102. The top integrated circuit package 224 can include additional integrated circuit devices, such as integrated circuit dice, flip chips, wire bonded chips, or packaged integrated circuits. For example, a second top integrated circuit device 234, such as an integrated circuit die, can be mounted on or over a top side of the top package carrier 228 with the top side of the top package carrier 228 facing the bottom side of the top interposer 104.

The top integrated circuit package 224 may be or may include a Known Good Package ("KGP"). For example, the first top integrated circuit device 232, additional integrated circuit devices such as the second top integrated circuit device 234 or any combination thereof may be tested before or after the top encapsulation 102 is formed. Furthermore, the top integrated circuit package 224 may be functionally tested before mounting the top integrated circuit package 224 over the base integrated circuit package 208. This feature can further reduce manufacturing cost, increase yield, and increase reliability.

The top package carrier 228 can be electrically coupled to the top interposer 104 with a top internal interconnect 236 such as a wire, wire-bond wire or wire bond ribbon. Other examples of the top internal interconnect 236 include solder balls, column grid arrays, pin interconnects, post interconnects, interconnects formed using folded printed circuit boards (PCBs) or combinations thereof.

It has been discovered that some embodiments of the present invention, such as the stacked integrated circuit package system 100, can provide a stacked integrated circuit package system with reduced profile. For example, the stacked integrated circuit package system 100 includes the top interposer 104 and disposed in the recess 226. This configuration can provide connectivity of the stacked integrated circuit package system 100 to external systems with a reduced system height.

Although the base integrated circuit package 208 is illustrated with the first base integrated circuit device 212 mounted over the base package carrier 210, it is understood that the base integrated circuit package 208 can include multichip packages, flip chip packages, lead frame base packages, board-on-chip (BOC) packages, system-on-a-package (SIP) packages, package-in-a-package (PiP) packages and any combination thereof.

For illustrative purposes, the stacked integrated circuit package system 100 is shown with the base package carrier 210 and the top package carrier 228 of the same dimensions. However, it is understood the base package carrier 210 and the top package carrier 228 can have different relative dimensions.

For illustrative purposes, the base interposer 216 is illustrated with the central aperture 218 with the first base integrated circuit device 212 within the central aperture 218 of the base interposer 216. However, it is understood that in the stacked integrated circuit package system 100, the first base integrated circuit device 212 may not be mounted within the central aperture 218 of the base interposer 216.

Furthermore, it is understood that interposers without the central aperture 218 may be used in conjunction with the current invention. For example, in some embodiments, a solid or perforated interposer or an interposer formed from multiple pieces may be mounted over the base package carrier with the first base integrated circuit device mounted above or below the base interposer. Furthermore, the base integrated circuit package can include a base interposer that does not provide electrical interconnection.

Figure 3:
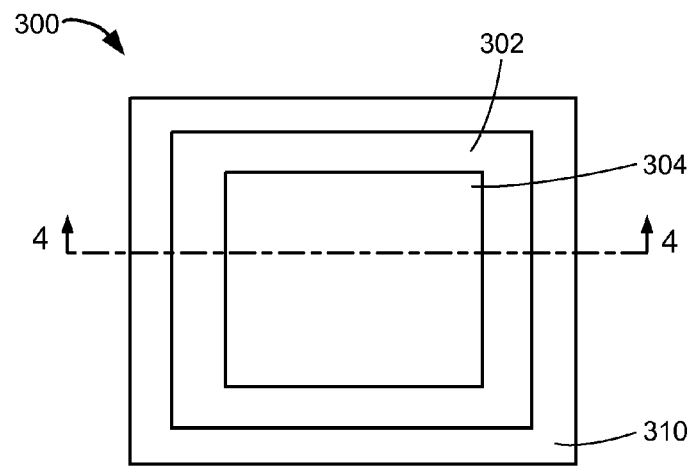
FIG. 3 is a top view of a stacked integrated circuit package system in a second embodiment of the present invention.

Referring now to FIG. 3, therein is shown a top view of a stacked integrated circuit package system 300 in a second embodiment of the present invention. The top view depicts a top encapsulation 302, such as a cover including an epoxy molding compound, and a base package carrier 310, such as a laminated substrate. A top interposer 304, such as a laminated substrate or interposer, can be exposed by the top encapsulation 302.

Figure 4:
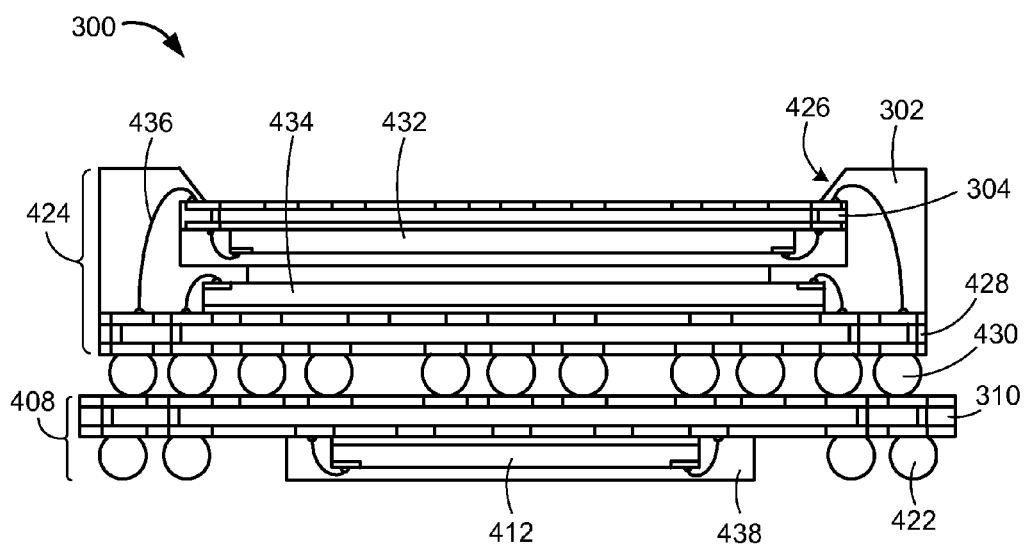
FIG. 4 is a cross-sectional view of the stacked integrated circuit package system along line 4-4 of FIG. 3.

Referring now to FIG. 4, therein is shown a cross-sectional view of the stacked integrated circuit package system 300 along line 4-4 of FIG. 3. The cross-sectional view depicts a base integrated circuit package 408 with the base package carrier 310. The base integrated circuit package 408 can include a first base integrated circuit device 412 such as a flip chip, a wire bonded chip, or a packaged integrated circuit. The first base integrated circuit device 412 can be mounted under and to the base package carrier 310. The base integrated circuit package 408 can include a base encapsulation 438, such as a cover including an epoxy molding compound.

The base integrated circuit package 408 can include additional integrated circuit devices such one or more flip chips, wire bonded chips, or packaged integrated circuits. The base integrated circuit package 408 may be or may include a Known Good Package ("KGP") that has been functionally tested.

A base external interconnect 422, such as a solder ball, can attach to the stacked integrated circuit package system 300 for connection to the next system level (not shown), such as a printed circuit board or another integrated circuit package system. In this example, the base external interconnect 422 is attached below and to the base package carrier 310.

A top integrated circuit package 424 is mounted over the base integrated circuit package 408. The top encapsulation 302 of the top integrated circuit package 424 includes a recess 426 which exposes the top interposer 304. The top integrated circuit package 424 can include a top package carrier 428. In this example, the recess 426 is over the top package carrier 428.

A base intra-stack interconnect 430, such as a solder ball, can form an interconnection between the base integrated circuit package 408 and the top integrated circuit package 424. Other examples of the base intra-stack interconnect 430 include column grid arrays, pin interconnects, post interconnects, interconnects formed using folded printed circuit boards (PCBs) or combinations thereof. In this example, the base intra-stack interconnect 430 is mounted over the base package carrier 310 and couples the base integrated circuit package 408 to the top integrated circuit package 424 through the top package carrier 428.

The top integrated circuit package 424 can include a first top integrated circuit device 432 such as one or more flip chips, wire bonded chips, or packaged integrated circuits. The first top integrated circuit device 432 can be under the top interposer 304. The top integrated circuit package 424 can include additional integrated circuit devices such as flip chips, wire bonded chips, or packaged integrated circuits. For example, a second top integrated circuit device 434 can be mounted over the top package carrier 428.

The top integrated circuit package 424 may be or may include a Known Good Package ("KGP"). For example, the first top integrated circuit device 432, additional integrated circuit devices such as the second top integrated circuit device 434 or any combination thereof may be tested before or after the top encapsulation 302 is formed. Furthermore, the top integrated circuit package 424 may be functionally tested before mounting the top integrated circuit package 424 over the base integrated circuit package 408. This feature can further reduce manufacturing cost and increase reliability.

The top package carrier 428 can be electrically coupled to the top interposer 304 with a top internal interconnect 436 such as a wire, wire-bond wire or wire bond ribbon. Other examples of the top internal interconnect 436 include solder balls, column grid arrays, pin interconnects, post interconnects, interconnects formed using folded printed circuit boards (PCBs) or combinations thereof.

Although the base integrated circuit package 408 is illustrated with one integrated circuit device (base integrated circuit device 412) mounted under the base package carrier 310, it is understood that the base integrated circuit package 408 can include multichip packages, flip chip packages, lead frame base packages, board-on-chip (BOC) packages, system-on-a-package (SIP) packages, package-in-a-package (PiP) packages and any combination thereof.

Figure 5:
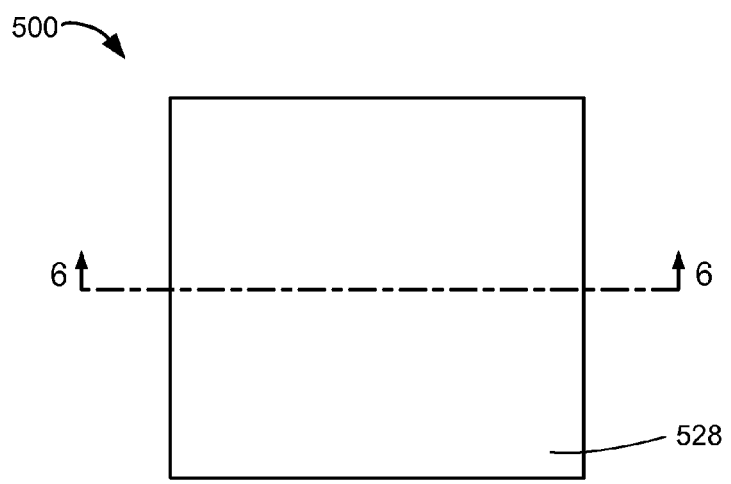
FIG. 5 is a top view of a stacked integrated circuit package system in a third embodiment of the present invention.

Referring now to FIG. 5, therein is shown a top view of a stacked integrated circuit package system 500 in a third embodiment of the present invention. The top view depicts a top package carrier 528, such as a laminated substrate, a top external interconnect 506.

Figure 6:
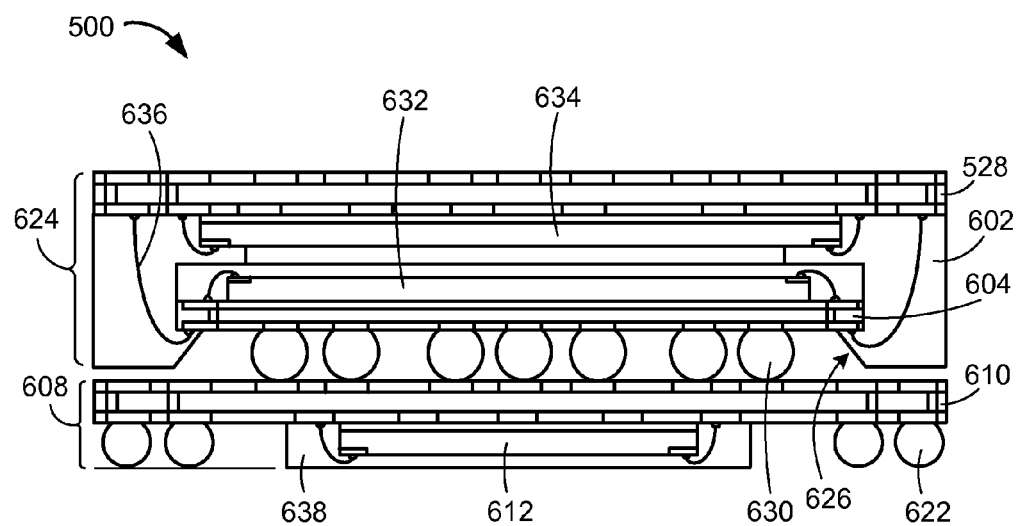
FIG. 6 is a cross-sectional view of the stacked integrated circuit package system along line 6-6 of FIG. 5.

Referring now to FIG. 6, therein is shown a cross-sectional view of the stacked integrated circuit package system 500 along line 6-6 of FIG. 5. The cross-sectional view depicts a base integrated circuit package 608. The base integrated circuit package 608 can include a base package carrier 610 and a first base integrated circuit device 612, such as a flip chip, a wire bonded chip, or a packaged integrated circuit. The first base integrated circuit device 612 can be mounted under the base package carrier 610. The base integrated circuit package 608 can include a base encapsulation 638, such as a cover including an epoxy molding compound.

The base integrated circuit package 608 can include additional integrated circuit devices such one or more flip chips, wire bonded chips, or packaged integrated circuits. The base integrated circuit package 608 may be or may include a Known Good Package ("KGP") that has been functionally tested.

The base package carrier 610 may include other structures (not shown), such as metal traces, metal layers, insulating layers, electrical vias, landing pads, or a combination thereof. A base external interconnect 622, such as a solder ball, can attach to the stacked integrated circuit package system 500 for connection to the next system level (not shown), such as a printed circuit board or another integrated circuit package system. In this example, the base external interconnect 622 is attached below and to the base package carrier 610.

A top integrated circuit package 624 is mounted over the base integrated circuit package 608. A top encapsulation 602, such as a cover including an epoxy molding compound, of the top integrated circuit package 624 includes a recess 626 which exposes a top interposer 604, such as a laminated substrate. The top integrated circuit package 624 can include the top package carrier 528. In this example, the recess 626 is below the top package carrier 528. This configuration may be referred to as an "upside down" or "inverted" package-on-package (POP) system.

A base intra-stack interconnect 630, such as a solder ball, can form an interconnection between the base integrated circuit package 608 and the top integrated circuit package 624. Other examples of the base intra-stack interconnect 630 include column grid arrays, pin interconnects, post interconnects, interconnects formed using folded printed circuit boards (PCBs) or combinations thereof. In this example, the base intra-stack interconnect 630 is mounted over the base package carrier 610 and couples the base integrated circuit package 608 to the top integrated circuit package 624 through the top interposer 604.

It has been discovered that some embodiments of the present invention, such as the stacked integrated circuit package system 500, can provide a stacked integrated circuit package system with reduced profile. For example, the stacked integrated circuit package system 500 includes the base intra-stack interconnect 630, such as a solder ball, formed below the top interposer 604 and disposed in the recess 626. This configuration can provide the functionality of internal system interconnection with a reduced system height.

The top integrated circuit package 624 can include a first top integrated circuit device 632 such as one or more flip chips, wire bonded chips, or packaged integrated circuits. The first top integrated circuit device 632 can be over the top interposer 604. The top integrated circuit package 624 can include additional integrated circuit devices such as flip chips, wire bonded chips, or packaged integrated circuits. For example, a second top integrated circuit device 634, such as an integrated circuit die, can be mounted under the top package carrier 528.

The top integrated circuit package 624 may be or may include a Known Good Package ("KGP"). For example, the first top integrated circuit device 632, additional integrated circuit devices such as the second top integrated circuit device 634 or any combination thereof may be tested before or after the top encapsulation 602 is formed. Furthermore, the top integrated circuit package 624 may be functionally tested before mounting the top integrated circuit package 624 over the base integrated circuit package 608. This feature can further reduce manufacturing cost, increase yield, and increase reliability.

The top package carrier 528 can be electrically coupled to the top interposer 604 with a top internal interconnect 636 such as a wire, wire-bond wire or wire bond ribbon. Other examples of the top internal interconnect 636 include solder balls, column grid arrays, pin interconnects, post interconnects, interconnects formed using folded printed circuit boards (PCBs) or combinations thereof.

The top external interconnect 506, such as a solder ball, can attach to the stacked integrated circuit package system 500 for connection to the next system level (not shown), such as a printed circuit board or another integrated circuit package system. In this example, the top external interconnect 506 is attached over and to the top package carrier 528.

Although the base integrated circuit package 608 is illustrated with the first base integrated circuit device 612 mounted under the base package carrier 610, it is understood that the base integrated circuit package 608 can include multichip packages, flip chip packages, lead frame base packages, board-on-chip (BOC) packages, system-on-a-package (SIP) packages, package-in-a-package (PiP) packages and any combination thereof.

Figure 7:
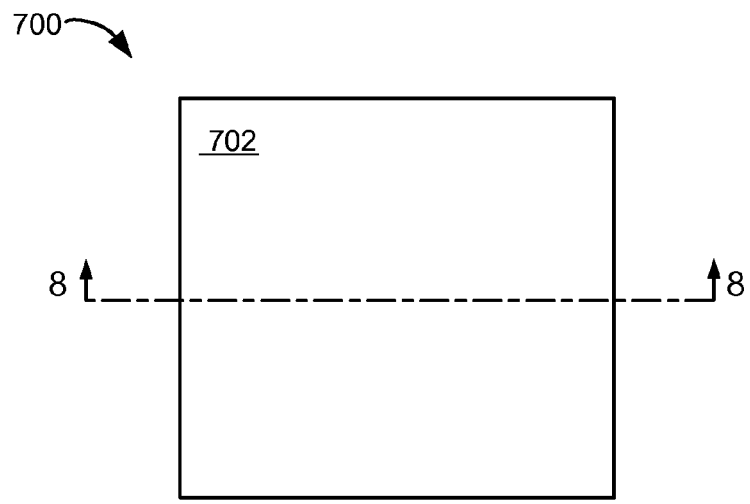
FIG. 7 is a top view of a stacked integrated circuit package system in a fourth embodiment of the present invention.

Referring now to FIG. 7, therein is shown a top view of a stacked integrated circuit package system 700 in a fourth embodiment of the present invention. The top view depicts a top package encapsulation 702, such as a cover including an epoxy molding compound.

Figure 8:
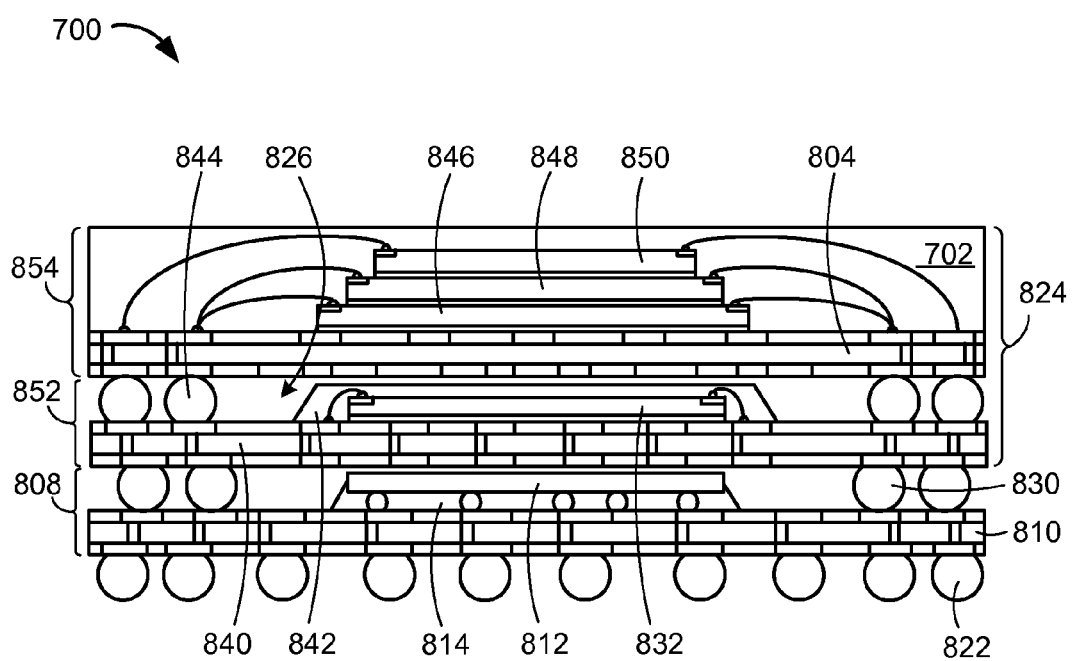
FIG. 8 is a cross-sectional view of the stacked integrated circuit package system along line 8-8 of FIG. 7.

Referring now to FIG. 8, therein is shown a cross-sectional view of the stacked integrated circuit package system 700 along line 8-8 of FIG. 7. The cross-sectional view depicts a base integrated circuit package 808. The base integrated circuit package 808 includes a first base integrated circuit device 812 such as a flip chip, a wire bonded chip, or a packaged integrated circuit. The first base integrated circuit device 812 can be mounted over a base package carrier 810, such as a laminated substrate. The base integrated circuit package 808 can include a base underfill 814, such as an epoxy molding compound, under the first base integrated circuit device 812.

The base integrated circuit package 808 can include additional integrated circuit devices such one or more flip chips, wire bonded chips, or packaged integrated circuits. The base integrated circuit package 808 may be or may include a Known Good Package ("KGP") that has been functionally tested.

A base external interconnect 822, such as a solder ball, can attach to the stacked integrated circuit package system 700 for connection to the next system level (not shown), such as a printed circuit board or another integrated circuit package system. In this example, the base external interconnect 822 is attached below and to the base package carrier 810.

A top integrated circuit package 824 is mounted over the base integrated circuit package 808. The top integrated circuit package 824 of the top integrated circuit package 824 includes a first top integrated circuit device 832 such as one or more flip chips, wire bonded chips, or packaged integrated circuits. The first top integrated circuit device 832 can be mounted over an intermediate package carrier 840, such as a laminated substrate. The intermediate package carrier is optional.

An encapsulant protrusion 842, such as a cover including an epoxy molding compound, can be formed over the first top integrated circuit device 832. The top integrated circuit package 824 can include additional integrated circuit devices such as flip chips, wire bonded chips, or packaged integrated circuits. In this example, base intra-stack interconnects 830, such as solder balls, are mounted over the base package carrier 810 and couple the base integrated circuit package 808 to the top integrated circuit package 824 through the intermediate package carrier 840.

The top integrated circuit package 824 includes a top interposer 804, such as a laminated substrate. Top intra-stack interconnects 844 are single conductive structures such as solder balls which are not formed from different processes or materials. The top intra-stack interconnects 844 can form an electrical interconnection between the intermediate package carrier 840 and the top interposer 804. Other examples of the top intra-stack interconnects 844 include column grid arrays, pin interconnects and post interconnects.

It has been discovered that some embodiments of the present invention, such as the stacked integrated circuit package system 700, can provide a stacked integrated circuit package system with reduced profile. For example, the stacked integrated circuit package system 700 includes top intra-stack interconnects which are single conductive structures, not formed from different processes or materials. Single conductive structures can provide reduced profile interconnects compared to some compound structures, such as pillar and solder ball intra-stack interconnects. Using single conductive structures for at least some of the intra-stack interconnects, such as the top intra-stack interconnects, can provide the functionality of internal system interconnection with a reduced system height.

In this example, the encapsulant protrusion 842 is over the intermediate package carrier 840. A cavity 826 is formed as the space between the top intra-stack interconnects 844 and the top interposer 804 with the top interposer 804 exposed by the cavity 826.

A first mounting integrated circuit device 846, such as a flip chip, a wire bonded chip, or a packaged integrated circuit, can be mounted over the top interposer 804. The additional integrated circuit devices such as flip chips, wire bonded chips, or packaged integrated circuits can be mounted over the top interposer 804. For example, a second mounting integrated circuit device 848, such as an integrated circuit die, and a third mounting integrated circuit device 850, such as an integrated circuit die, can be mounted over the top interposer 804. In this example, the top package encapsulation 702 is formed over the top interposer 804.

Portions of the stacked integrated circuit package system 700 can be pre-assembled and then mounted to form the stacked integrated circuit package system 700. For example, an intermediate integrated circuit package 852 including the intermediate package carrier 840 and the encapsulant protrusion 842 thereover may be pre-assembled.

In this example, the first top integrated circuit device 832 can be mounted over the intermediate package carrier 840 and the encapsulant protrusion 842 can be formed over the first top integrated circuit device 832. After pre-assembly, the intermediate integrated circuit package 852 can be mounted over the base integrated circuit package 808 or included in another assembly before mounting over the base integrated circuit package 808.

A mounting integrated circuit package 854 including the top interposer 804 can be pre-assembled. For example, the first mounting integrated circuit device 846 as well as additional mounting integrated circuit devices, such as the second mounting integrated circuit device 848 and the third mounting integrated circuit device 850, can be mounted over the top interposer 804, forming the mounting integrated circuit package 854. The top package encapsulation 702 can be formed over the top interposer 804 before or after the mounting integrated circuit package 854 is mounted over the intermediate package carrier 840. The mounting integrated circuit package 854 can be mounted over the intermediate package carrier 840 with the top intra-stack interconnects 844, forming the cavity 826 as a space between the top intra-stack interconnects 844 and the top interposer 804.

The base integrated circuit package 808, the intermediate integrated circuit package 852 and the mounting integrated circuit package 854 may be pre-assembled in various orders. For example, the mounting integrated circuit package 854 can be mounted over the intermediate integrated circuit package 852 with the top intra-stack interconnects 844 before mounting the intermediate integrated circuit package 852 over the base integrated circuit package 808 with the base intra-stack interconnects 830, forming the stacked integrated circuit package system 700.

In another example, the intermediate integrated circuit package 852 can be assembled and mounted over the base integrated circuit package 808 before an assembly including the mounting integrated circuit package 854 is mounted over the intermediate integrated circuit package 852, forming the cavity 826 as a space between the top intra-stack interconnects 844 and the top interposer 804.

The base integrated circuit package 808, the intermediate integrated circuit package 852 or the mounting integrated circuit package 854 or combinations thereof may be or may include a Known Good Package ("KGP"). Furthermore, the base integrated circuit package 808, the intermediate integrated circuit package 852 or the mounting integrated circuit package 854 or combinations thereof may be functionally tested before the stacked integrated circuit package system 700 is fully assembled. This feature can further reduce manufacturing cost and increase reliability.

The stacked integrated circuit package system 700 is illustrated with the cavity 826 formed as the space between the top intra-stack interconnects 844 and the top interposer 804 with the top interposer 804 exposed by the cavity 826. However, it is understood that the top interposer 804 may be partially exposed by the cavity 826. For example, the region between the top interposer 804 and the encapsulant protrusion 842 may be partially or completely filled by the encapsulant protrusion 842 or another structure, such as a thermally conductive material or an epoxy, as long as some portion of the top interposer 804 remains exposed by the cavity 826 between the top intra-stack interconnects 844 and the top interposer 804.

Although the base integrated circuit package 808 is illustrated with the first base integrated circuit device 812 mounted over the base package carrier 810, it is understood that the base integrated circuit package 808 can include multichip packages, flip chip packages, lead frame base packages, board-on-chip (BOC) packages, system-on-a-package (SIP) packages, package-in-a-package (PiP) packages and any combination thereof.

It has been discovered that the present invention provides a compact stacked integrated circuit package system. The present invention can provide improved yields due to the modular nature of the system. The base integrated circuit package and the top integrated circuit package may be independently tested or characterized before assembly in a stacked integrated circuit package system according to the current invention.

It also has been discovered that the present invention provides a stacked integrated circuit package system with improved thermal management properties. For example, the gaps in the current invention such as the cavity can provide air flow channels for improved heat dissipation.

Yet an important aspect of the present invention is that the present invention can provide a system capable of complex internal interconnections. Some embodiments of the current invention include a base package carrier, a base interposer, a top package carrier and a top interposer including structures such as metal traces, metal layers, insulating layers, electrical vias, landing pads, or a combination thereof for providing complex interconnections. When implemented in conjunction with base intra-stack interconnects, base interposer interconnects and top internal interconnects, the present invention can enable the implementation of complex interconnected systems including two or more integrated circuit devices with a small footprint.

Figure 9:
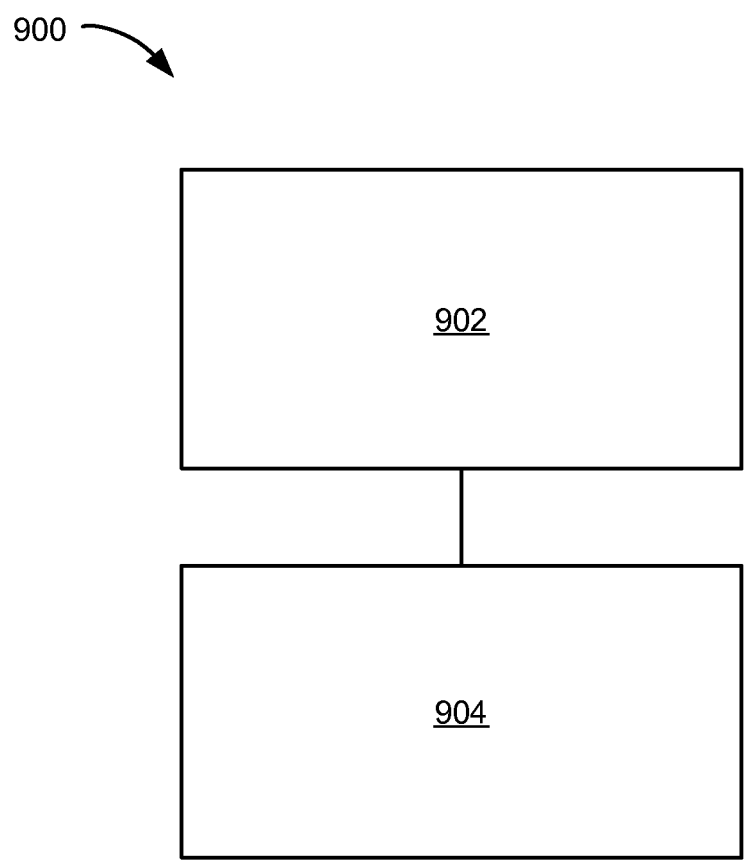
FIG. 9 is a flow chart of a stacked integrated circuit package system for manufacturing of the stacked integrated circuit package system in an embodiment of the present invention.

Referring now to FIG. 9 therein is shown a flow chart of a stacked integrated circuit package system 900 for manufacturing of the stacked integrated circuit package system 100 in an embodiment of the present invention. The system 900 includes providing a base integrated circuit package, in a block 902; and mounting a top integrated circuit package having a top interposer and a top encapsulation with a cavity therein or the cavity as a space between top intra-stack interconnects and the top interposer, with the top interposer exposed by the cavity, over the base integrated circuit package, in a block 904.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for improving yield, increasing reliability, and reducing cost of circuit system. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of a stacked integrated circuit package system comprising:
   providing a base integrated circuit package including:
      providing a base package carrier,
      mounting a base interposer over the base package carrier, the base interposer having a central aperture,
      forming a base intra-stack interconnect on a top surface of the base interposer,
      forming a base interposer interconnect on a bottom surface of the base interposer, and
      mounting a flip chip within the central aperture and on the base package carrier; and
   mounting a top integrated circuit package on the base intra-stack interconnect and over the base interposer, the top integrated circuit package including:
      a top interposer,
      a top package carrier below the top interposer and with the base intra-stack interconnect on a bottom surface of the top package carrier and with the flip chip in direct contact with the bottom surface of the top package carrier, and
      a top encapsulation on the top package carrier and the top interposer with a recess therein with the top interposer exposed by the recess.

2. The method as claimed in claim 1 wherein mounting the flip chip includes mounting the flip chip over the base package carrier.

3. The method as claimed in claim 1 wherein mounting a top integrated circuit package includes:
   mounting a first top integrated circuit device on the top interposer; and
   mounting a second top integrated circuit device on the top package carrier.

4. The method as claimed in claim 1 wherein mounting the top integrated circuit package having the top encapsulation with the recess therein and the top interposer exposed by the recess includes providing the top package carrier with the recess over the top package carrier.

5. The method as claimed in claim 1 further comprising forming a base external interconnect below the base integrated circuit package.

6. A method of manufacture of a stacked integrated circuit package system comprising:
   providing a base integrated circuit package including:
      providing a base package carrier,
      mounting a base interposer over the base package carrier, the base interposer having a central aperture,
      forming a base intra-stack interconnect on a top surface of the base interposer,
      forming a base interposer interconnect on a bottom surface of the base interposer, and
      mounting a flip chip within the central aperture and on the base package carrier;
   forming a base external interconnect below the base integrated circuit package; and
   mounting a top integrated circuit package on the base intra-stack interconnect and over the base interposer, the top integrated circuit package including:
      a top interposer,
      a top package carrier below the top interposer and with the base intra-stack interconnect on a bottom surface of the top package carrier and with the flip chip in direct contact with the bottom surface of the top package carrier, and
      a top encapsulation on the top package carrier and the top interposer with a recess therein with the top interposer exposed by the recess.

7. The method as claimed in claim 6 wherein:
   forming the base intra-stack interconnect on the top surface of the base interposer includes coupling the base integrated circuit package to the top package carrier.

8. The method as claimed in claim 6 wherein the base interposer interconnect is used to couple the base package carrier and the base interposer.

9. A stacked integrated circuit package system comprising:
   a base integrated circuit package including:
      a base package carrier,
      a base interposer mounted over the base package carrier, the base interposer having a central aperture,
      a base intra-stack interconnect on a top surface of the base interposer,
      a base interposer interconnect on a bottom surface of the base interposer; and
      a flip chip mounted within the central aperture and on the base package carrier; and a top integrated circuit package mounted on the base intra-stack interconnect and over the base interposer, the top integrated circuit package including:
a top interposer,
a top package carrier below the top interposer and with the base intra-stack interconnect on a bottom surface of the top package carrier and with the flip chip in direct contact with the bottom surface of the top package carrier, and
a top encapsulation on the top package carrier and the top interposer with a recess therein with the top interposer exposed by the recess.

10. The system as claimed in claim 9 wherein the flip chip is mounted over the base package carrier.

11. The system as claimed in claim 9 wherein the top integrated circuit package includes:
a first top integrated circuit device mounted on the top interposer; and
a second top integrated circuit device mounted on the top package carrier.

12. The system as claimed in claim 9 wherein the recess is over the top package carrier.

13. The system as claimed in claim 9 further comprising a base external interconnect formed below the base integrated circuit package.

14. The system as claimed in claim 9 further comprising a base underfill under the flip chip.

15. The system as claimed in claim 14 wherein the base intra-stack interconnect couples the base integrated circuit package to the top package carrier.

16. The system as claimed in claim 14 wherein the base interposer interconnect is used to couple the base package carrier and the base interposer.

* * * * *